(12) United States Patent
Lai et al.

(10) Patent No.: US 12,091,767 B2
(45) Date of Patent: Sep. 17, 2024

(54) LAMINATE AND PREPARING METHOD THEREOF

(71) Applicant: MICROCOSM TECHNOLOGY CO., LTD., Tainan (TW)

(72) Inventors: Bo-Hung Lai, Tainan (TW); Tang-Chieh Huang, Tainan (TW)

(73) Assignee: MICROCOSM TECHNOLOGY CO., LTD., Tainan (TW)

( * ) Notice: Subject to any disclaimer, the term of this patent is extended or adjusted under 35 U.S.C. 154(b) by 316 days.

(21) Appl. No.: 17/404,562

(22) Filed: Aug. 17, 2021

(65) Prior Publication Data

US 2022/0205123 A1 Jun. 30, 2022

(30) Foreign Application Priority Data

Dec. 25, 2020 (TW) ................................ 109146314

(51) Int. Cl.
*C25D 5/56* (2006.01)
*B32B 15/08* (2006.01)
(Continued)

(52) U.S. Cl.
CPC ................. *C25D 5/56* (2013.01); *B32B 15/08* (2013.01); *B32B 27/08* (2013.01); *B32B 27/281* (2013.01);
(Continued)

(58) Field of Classification Search
CPC ......... B32B 7/12; B32B 15/08; B32B 27/281; B32B 27/08; H05K 2203/0723
See application file for complete search history.

(56) References Cited

U.S. PATENT DOCUMENTS

| | | | | |
|---|---|---|---|---|
| 2006/0257625 | A1* | 11/2006 | Wakizaka | B32B 15/085 427/337 |
| 2008/0032144 | A1* | 2/2008 | Hashimoto | C08J 5/18 428/480 |
| 2016/0369053 | A1* | 12/2016 | Chiang | H05K 1/0353 |

FOREIGN PATENT DOCUMENTS

JP 2014138051 A * 7/2014

OTHER PUBLICATIONS

Partial machine translation of JP-2014138051-A (obtained Aug. 24, 2023).*

* cited by examiner

*Primary Examiner* — Kregg T Brooks
(74) *Attorney, Agent, or Firm* — Cermak & McGowan LLP; Shelly Guest Cermak

(57) ABSTRACT

The present invention provides a laminate with good adhesion, which includes a transparent substrate, an adhesive layer formed by an adhesive composition, and a metal layer. The adhesive composition contains a resin, an adhesion promoter selected from a triazole compound represented by formula (1), a thiadiazole compound represented by formula (2), a benzotriazole compound represented by formula (3) or a phosphate oligomer; and an antioxidant, in which $R^1 \sim R^5$ are as defined herein.

(1)

(Continued)

-continued (2)

(3)

13 Claims, 1 Drawing Sheet (51) Int. Cl.
*B32B 27/08* (2006.01)
*B32B 27/28* (2006.01)
*C08K 5/3475* (2006.01)
*C08K 5/378* (2006.01)
*C08K 5/47* (2006.01)
*C09D 5/00* (2006.01)
*C09D 7/63* (2018.01)
*C09D 133/06* (2006.01)
*C09D 163/00* (2006.01)
*C09D 179/08* (2006.01)

(52) U.S. Cl.
CPC ............... *C09D 5/002* (2013.01); *C09D 7/63* (2018.01); *C09D 133/064* (2013.01); *C09D 163/00* (2013.01); *C09D 179/08* (2013.01); B32B 2307/412 (2013.01); C08K 5/3475 (2013.01); C08K 5/378 (2013.01); C08K 5/47 (2013.01); H05K 2203/0723 (2013.01)

LAMINATE AND PREPARING METHOD THEREOF

BACKGROUND OF THE INVENTION

This application claims priority under 35 U.S.C. § 119 to Taiwanese Patent App. No. 109146314, filed Dec. 25, 2020, the entirety of which is incorporated by reference herein.

FIELD OF THE INVENTION

The present invention relates to a laminate and, in particularly, to a laminate with good adhesion.

DESCRIPTION OF THE PRIOR ART

Flexible printed circuit boards have the advantages of being light, thin, short and small, and are widely used in small electronic products, such as mobile phones, digital cameras and digital video cameras. The COP (Chip on Film, chip on film packaging) technology is a technology that uses a flexible printed circuit board as a carrier for packaging a chip and combines the chip with the flexible printed circuit board circuit. With the development of transparent displays, flexible printed circuit boards or COF flexible printed circuit boards are required to have high transparency and low haze such that they can be combined with light-emitting elements and applied to sub-millimeter light-emitting diodes (mini LED) or micro light-emitting diodes (Micro LED) display substrate.

Currently, substrate manufacturers mainly adopt three methods for processing the copper foil part. The first is the copper foil rolling method, the second is sputtering for seed growth/copper electroplating and thickening method, and the third is metal chemical plating of the wet process for seed growth/copper electroplating and thickening method.

The copper foil rolling method uses polyimide (PI) film as the substrate. A layer of adhesive or thermoplastic material is coated on the PI film and then hot-pressed and bonded with the copper foil, in which the roughening of the surface of the copper foil is utilized to closely bonded with the glue. This method will cause roughness on the surface of the flexible printed circuit board, which will affect the optical transmittance and haze. In order to improve the optical transmittance and haze, it is necessary to reduce the surface roughness of the copper foil, which in turn reduces the bonding force between the copper foil and PI and cannot be used.

Sputtering method for seed growth/copper electroplating and thickening method uses PI as the substrate, sputters chromium as an intermediary layer on the PI film, then sputters copper metal as the seed layer, and then electroplates copper to increase the thickness of the copper layer. The metal chemical plating method of the wet process for seed growth/copper electroplating and thickening method uses PI as the substrate, grows nickel or copper as the seed layer on the PI film by chemical reduction method, and then grows the copper film by electroplating copper. In these two methods, the surface roughness of the PI film is generally 10-20 nm, which leads to poor adhesion. The PI film needs to be surface treated with plasma or short-wavelength ultraviolet light, but both the temperature and humidity of the subsequent process will deteriorate the adhesive force and thus cause peeling.

SUMMARY OF THE INVENTION

In view of the above technical problems, an object of the present invention is to provide a laminate, which does not affect the optical transmittance and haze while maintaining the peeling strength between the metal layer and the adhesive layer at greater than 7 N/cm and solves the problem of adhesion deterioration due to temperature and humidity, and its manufacturing method thereof.

To achieve the above object, the present invention provides a laminate, which comprises: a transparent substrate; an adhesive layer formed by an adhesive composition and located on and in contact with the transparent substrate; and a metal layer located on and in contact with the adhesive layer, and a surface roughness (Rz) of a contact side of the metal layer with the adhesive layer is less than 0.05 μm, wherein the metal layer is formed by forming a seed layer and then electroplating, the adhesive composition comprises a resin, an adhesion promoter and an antioxidant, and the adhesion promoter comprises a triazole compound represented by formula (1), a thiadiazole compound represented by formula (2), a benzotriazole compound represented by formula (3), a phosphate oligomer or a combination thereof:

wherein
$R^1$, $R^2$, $R^3$ and $R^4$ each independently represent H, $NH_2$, SH, OH, COOH, Ph, a hydrocarbon group having 1 to 8 carbon atoms, or a hydrocarbon group having 1 to 8 carbon atoms with an end functional group, which is selected from $NH_2$, SH, OH, COOH or Ph; and
$R^5$ represents H, $NH_2$, SH, OH, COOH, $CH_3$ or $C_2H_5$.

Preferably, the seed layer is formed by sputtering, chemical plating or deposition.

Preferably, the resin comprises a thermoplastic resin, a thermosetting resin, a (meth)acrylic resin, an urethane resin, a modified liquid crystal polymer, a polyester resin or a combination thereof.

Preferably, the triazole compound represented by formula (1) comprises or a combination thereof.

Preferably, the thiadiazole compound represented by formula (2) comprises or a combination thereof.

Preferably, the benzotriazole compound represented by formula (3) comprises or a combination thereof.

Preferably, the phosphate oligomer comprises acrylic phosphate, alcohol phosphate, alcohol and alkyl ether phosphate, alcohol and alkyl polyethylene glycol ether phosphate or a combination thereof.

The present invention also provides a method for preparing a laminate, which comprises: providing a transparent substrate; forming an adhesive layer on and in contact with the transparent substrate, in which the adhesive layer is formed by an adhesive composition; forming a metal layer on and in contact with the adhesive layer to obtain the laminate, wherein a surface roughness (Rz) of a contact side of the metal layer with the adhesive layer is less than 0.05 μm; the metal layer is formed by forming a seed layer and then electroplating; and the adhesive composition comprises a resin, an adhesion promoter and an antioxidant, and the adhesion promoter comprises a triazole compound represented by formula (1), a thiadiazole compound represented by formula (2), a benzotriazole compound represented by formula (3), a phosphate oligomer or a combination thereof:

(1)

(2)

(3)

wherein $R^1$, $R^2$, $R^3$ and $R^4$ each independently represent H, $NH_2$, SH, OH, COOH, Ph, a hydrocarbon group having 1 to 8 carbon atoms, or a hydrocarbon group having 1 to 8 carbon atoms with an end functional group, which is selected from $NH_2$, SH, OH, COOH or Ph; and $R^5$ represents H, $NH_2$, SH, OH, COOH, $CH_3$ or $C_2H_5$.

Preferably, the seed layer is formed by sputtering, chemical plating or deposition.

Preferably, the triazole compound represented by formula (1) comprises or a combination thereof.

Preferably, the thiadiazole compound represented by formula (2) comprises

-continued or a combination thereof.

Preferably, the benzotriazole compound represented by formula (3) comprises or a combination thereof.

Preferably, the phosphate oligomer comprises acrylic phosphate, alcohol phosphate, alcohol and alkyl ether phosphate, alcohol and alkyl polyethylene glycol ether phosphate or a combination thereof.

According to the present invention, a transparent laminate with good peel strength and solder heat resistance can be obtained.

DETAILED DESCRIPTION OF THE EMBODIMENTS

The laminate provided by the present invention includes a transparent substrate; an adhesive layer; and a metal layer.

Figure 1:
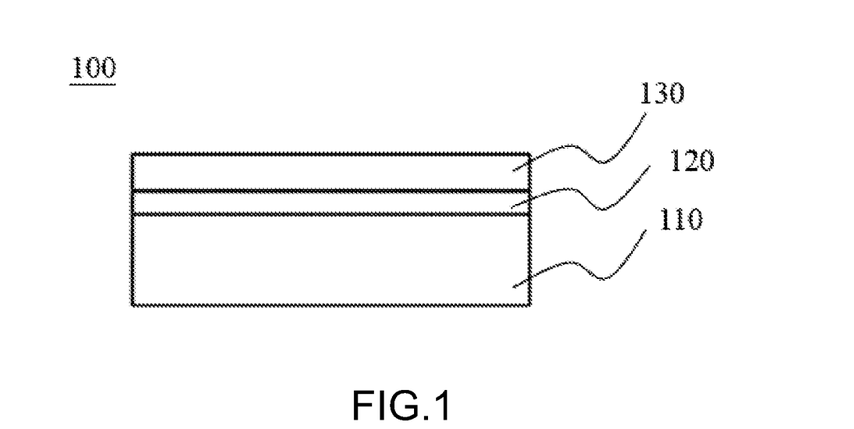
FIG. 1 is a schematic view showing a laminate according to a first embodiment of the present invention.

Please refer to FIG. 1, which schematically illustrates the structure of the laminate of the first embodiment of the present invention. The laminate 100 includes a transparent substrate 110; an adhesive layer 120 formed on and in direct contact with the transparent substrate 100; and a metal layer 130 formed on and in direct contact with the adhesive layer 120. That is, the metal layer 130 is attached to the transparent substrate 110 through the adhesive layer 120.

Figure 2:
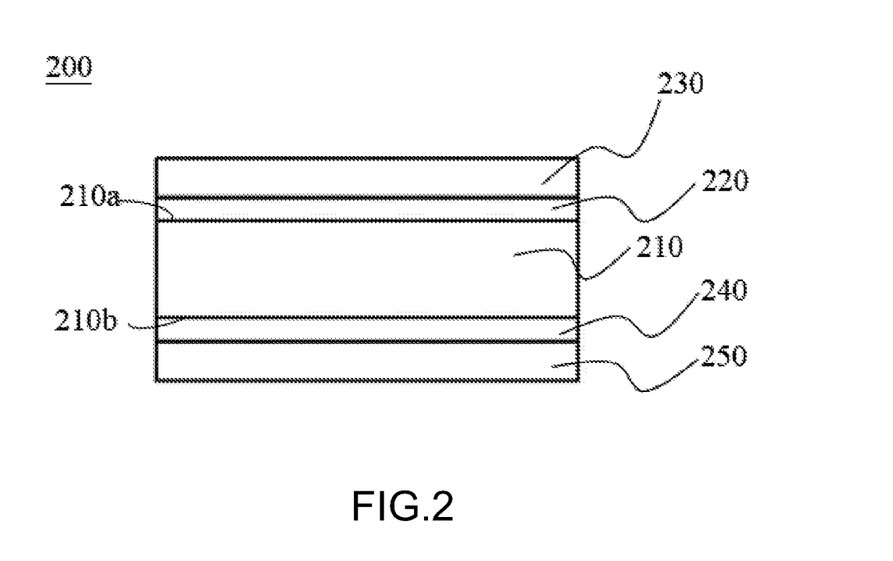
FIG. 2 is a schematic view showing a laminate according to a second embodiment of the present invention.

Please refer to FIG. 2, which schematically illustrates the structure of the laminate of the second embodiment of the present invention. The laminate 200 includes a transparent substrate 210; a first adhesive layer 220; a second adhesive layer 240; a first metal layer 230; and a second metal layer 250. The transparent substrate 210 has a first surface 210a and a second surface 210b opposite to the first surface 210a. The first metal layer is attached to the first surface of the transparent substrate through the first adhesive layer; and the second metal layer is attached to the second surface of the transparent substrate through the second adhesive layer.

Preferably, the surface of the metal layer adhered to the adhesive layer is as smooth as possible. The so-called smooth here means that the surface roughness (Rz) of the contact side of the metal layer with the adhesive layer is less than 0.05 μm.

The thickness of the metal layer is not particularly limited, and an appropriate thickness can be selected. From the viewpoint of workability, it is preferably 1-35 μm. In the present invention, the metal layer is formed by forming a seed layer and then electroplating. More specifically, the metal layer is formed by forming a seed layer on the adhesive layer first, and then copper electroplating for thickening to the required thickness. The thickness of the seed layer may be 0.1-1 μm, preferably 0.2-0.8 μm, more preferably 0.2-0.6 μm. The material of the seed layer can be copper, nickel, nickel-phosphorus alloy, nickel-boron alloy, nickel-chromium alloy, nickel-phosphorus-copper alloy, titanium, titanium-copper alloy, etc., but is not limited thereto. The seed layer can be formed by sputtering, chemical plating, or deposition.

In the present invention, the adhesive layer is formed by an adhesive composition. The adhesive composition includes a resin, an adhesion promoter and an antioxidant. The adhesive composition may or may not contain a hardener.

The adhesion promoter can be used alone or in combination of two or more, and can be a triazole compound represented by formula (1), a thiadiazole compound represented by formula (2), a benzotriazole compound represented by formula (3) or a phosphate oligomer:

(1)

(2)

(3)

wherein $R^1$, $R^2$, $R^3$ and $R^4$ each independently represent H, $NH_2$, SH, OH, COOH, Ph, a hydrocarbon group having 1 to 8 carbon atoms, or a hydrocarbon group having 1 to 8 carbon atoms with an end functional group, which is selected from $NH_2$, SH, OH, COOH or Ph; and $R^5$ represents H, $NH_2$, SH, OH, COOH, $CH_3$ or $C_2H_5$. Examples of the hydrocarbon group having 1 to 8 carbon atoms with an end functional group include —$CH_2CH_2NH_2$, —$CH_2CH_2CH_2COOH$, —$CH_2OH$ and —$CH_2CH_2OH$, but are not limited thereof.

In a preferred embodiment, based on the total weight of the adhesive composition, the added amount of the adhesion promoter is 0.05 to 3% by weight. The present invention uses the triazole compound, the benzotriazole compound, the thiadiazole compound or the phosphate oligomer to improve the affinity between the adhesive layer and the seed layer, thereby improving the interface peeling, and also improving the interface roughness between the adhesive layer and the metal layer, thus resulting in reduction of the optical haze.

The triazole compound represented by formula (1) can be used alone or in combination of two or more. The triazole compound represented by formula (1) includes but is not limited to:

The thiadiazole compound represented by formula (2) can be used alone or in combination of two or more. The thiadiazole compound represented by formula (2) includes but is not limited to:

The benzotriazole compound represented by formula (3) can be used alone or in combination of two or more. The benzotriazole compound represented by formula (3) includes but is not limited to:

In the present invention, the phosphate oligomer may be acrylic phosphate, such as: 2-(meth)acryloyloxyethyl dihydrogen phosphate, di(2-(meth)acryloyloxy) phosphate hydrogen, tri(meth)acryloyloxyethyl phosphorous, product number Anfeng Industrial AP-UV166, Qiaoyi Technology JT-S2168, JT-S2600, ADDOX-A40, Shengkai SF-785, Lubrizol 2063H, Lubrizol 2062H, Lubrizol C179N, Lubrizol 219, Lubrizol 2064, Xianjie ADH-162; alcohol phosphate, such as: product number Xianjie LYSAN 382PH, LYSAN 304PH, LYSAN KC918; alcohol and alkyl ether phosphate, such as: product number Xianjie LYSAN 3089H, LYSAN 829H; or alcohol and alkyl polyglycol ether phosphate, such as: product number Xianjie LYSAN 1239, LYSAN 1259. The phosphate oligomer can be used alone or in combination of two or more.

The resin may be thermoplastic resin (for example, the thermoplastic polyimide resin), thermosetting resin, (meth) acrylic resin, urethane resin, modified liquid crystal polymer, polyester resin or a combination of two or more of the aforementioned resins.

The thermoplastic polyimide resin preferably has transparency and can be formed by polymerizing more than one tetracarboxylic dianhydride and more than one diamine. "Thermoplastic" herein means that the resin having a glass transition temperature ranged from 100 to 250° C. and the resin can be melted and flowed through heating at a temperature above the glass transition temperature to be processed.

The tetracarboxylic dianhydride and the diamine are not particularly limited, as long as the formed polyimide has transparency and thermoplasticity. The tetracarboxylic dianhydride includes biphenyl tetracarboxylic dianhydride (BPDA), 4,4'-oxydiphthalic dianhydride (ODPA), sulfonyldiphthalic anhydride (SO2DPA), bis(3,4dicarboxyphenyl) dimethyl-silane dianhydride (SiDA), cyclobutane-1,2,3,4-tetracarboxylic dianhydride (CBDA), bicyclo[2.2.2]oct-7-ene-2,3,5,6-tetracarboxylic acid dianhydride (B1317), 4,4'-(hexafluoroisopropylene) diphthalic dianhydride (6FDA), 4,4-(hexafluoroisopropylene) diphthalic dianhydride, bisphenol A diether dianhydride (BPADA), ethylene glycol bisanhydrotrimellitate (TMEG), propylene glycol bis(trimellitic anhydride) (TMPG), bicyclo[2.2.1]heptane-2,3,5,6-tetracarboxylic dianhydride (BHDA), 1,2,3,4-cyclopentanetetracarboxylic dianhydride (CPDA), bicyclo[2.2.2]octane-2,3,5,6-tetracarboxylic dianhydride (BODA), bicyclo[2.2.1]heptane-2,3,5-tricarboxy-6-acetic dianhydride, butane-1,2,3,4-tetracarboxylic dianhydride, 3,3',4,4'-dicyclohexyltetracarboxylic dianhydride or 1,2,4,5-cyclohexanetetracarboxylic dianhydride (HPMDA), but is not limited thereto. The tetracarboxylic dianhydride can be used alone or in combination of two or more.

The diamine includes but is not limited to: 4,4'-oxydianiline (ODA), 1,3-bis(3-aminophenoxy)benzene (133APB), 1,3-bis(4-aminophenoxy)benzene (134APB), bis(4-aminophenyl)sulfone (4DDS), bis(3-aminophenyl)sulfone (3DDS), 1,3-cyclohexanediamine (13CHD), 1,4-cyclohexanediamine (14CHD), 9,9-bis(4-aminophenyl)fluorine (FDA), 9,9-bis(3-fluoro-4-aminophenyl)fluorine (FFDA), 2,2'-bis(trifluoromethyl)benzidine (TFMB), 2,2-bis(3-aminophenyl)-1,1,1,3,3,3-hexafluoropropane (BAPP), 2,2-bis(4-aminophenyl)hexafluoropropane (APHF), 2,2'-dimethylbenzidine (m-tolidine), 1,3-bis(3-aminophenoxy)benzene (TPE-M), 1,4-bis(4-aminophenoxy)benzene (TPE-Q), 1,3-bis(4-aminophenoxy)benzene (TPE-R), 1,4-bis(3-aminophenoxy)benzene, 2,5-bis(aminomethyl)bicyclo[2.2.1]heptane, 3,8-bis(aminomethyl)tricyclo[5.2.1.0]decane, 2,6-bis(aminomethyl)bicyclo[2.2.1]heptane, 1,3-diaminoadamantane, 2,2-bis(4-aminocyclohexyl)propane, 2,2-bis(4-aminocyclohexyl)hexafluoropropane, 1,3-propane diamine, 1,4-tetramethylene diamine, 1,5-pentamethylene diamine, 1,6-hexamethylene diamine, 1,7-heptamethylene diamine, 1,8-octamethylene diamine, 1,9-nonamethylene diamine, 1,12-dodecamethylene diamine and dimer diamine. The diamine can be used alone or in combination of two or more.

The thermosetting resin can be amine-based resins such as melamine resin, benzoguanamine resin, melamine derivatives, benzoguanamine derivatives, etc., blocked isocyanate compounds, cyclic carbonate compounds, molecules with cyclic (thio)ether-based thermosetting component, bismaleimide or carbodiimide resin.

The above-mentioned molecules with cyclic (thio) ether-based thermosetting components are compounds having a plurality of 3-, 4- or 5-membered cyclic (thio) ether groups in the molecules. For example, compounds having multiple epoxy groups in the molecules, i.e. multifunctional epoxy compounds; compounds having multiple oxetanyl groups in the molecules, i.e, multifunctional oxetane compounds; or compounds having multiple cyclic thioether groups in the molecules, i.e. cyclic sulfide resin. These compounds can be used alone or in combination of two or more.

The above-mentioned multifunctional epoxy compounds include epoxidized vegetable oils such as ADK CIZER O-130P, ADK CIZER D-32, ADK CIZER O-180A, ADK CIZER D-55 (ADEKA), etc.; bisphenol A epoxy resins such as jER828, jER834, jER1001 jER1004 (Mitsubishi Chemical), EHPE3150 (DAICEL), EPICLON 840, EPICLON 850, EPICLON 1050, EPICLON 2055 (DIC), EPO TOHTO YD-011, YD-013, YD-127, YD-128 (KUKDO Chemical), D.E.R.317, D.E.R.331, D.E.R.661, D.E.R.664 (Dow Chemical), SUMI-EPDXY ESA-011, ESA-014, ELA-115, ELA-128 (Sumitomo Chemical), A.E.R.330, A.E.R.331, A.E.R.661, A.E.R.664 (Asahi Kasei), etc.; hydroquinone epoxy resins such as YDC-1312 (KUKDO Chemical), etc.; bisphenol epoxy resins such as YSLV-80XY (KUKDO Chemical); thioether epoxy resins such as YSLV-120TE (KUKDO Chemical), etc.; brominated epoxy resins such as jERYL903 (Mitsubishi Chemical), EPICLON 152, EPICLON 165 (DIC), EPO TOHTO YDB-400, YDB-500 (KUKDO Chemical), D.E.R.542 (Dow Chemical), SUMI-EPDXY ESB-400, ESB-700 (Sumitomo Chemical), A.E.R.711, A.E.R.714 (Asahi Kasei), etc.; novolac epoxy resins such as jER152, jER154 (Mitsubishi Chemical), D.E.N.431, D.E.N.438 (Dow Chemical), EPICLON N-730, EPICLON N-770, EPICLON N-865 (DIC), EPO TOHTO YDCN-701, YDCN-704 (KUKDO Chemical), EPPN-201, EOCN-1025, EOCN-1020, EOCN-1045, RE-306 (Nippon Kayaku), SUMI-EPDXY ESCN-195X, A.E.R.ECN-235, ESCN-220 (Sumitomo Chemical), ECN-299 (Asahi Kasei), etc.; biphenol novolac epoxy resins such as NC-3000, NC-3100 (Japan Chemicals), etc.; bisphenol F epoxy resins such as EPICLON 830 (DIC), jER807 (Mitsubishi Chemical), YDF-175, EPO TOHTO YDF-170, YDF-2004 (KUKDO Chemical), etc.; hydrogenated bisphenol A epoxy resins such as EPO TOHTO ST-2004, ST-2007, ST-3000 (KUKDO Chemical), etc.; alicyclic epoxy resins such as jER604 (Mitsubishi Chemical), EPO TOHTO YH-434 (KUKDO Chemical), CELLOXIDE 2021 (Deicel), etc.; glycidylamine epoxy resins such as SUMI-EPDXY ELM-120 (Sumitomo Chemical) manufactured by Sumitomo Chemical Industries, Ltd.; hydantoin epoxy resin; trihydroxyphenylmethane epoxy resins such as YL-933 (Mitsubishi Chemical), T.E.N., EPPN-501, EPPN-502 (Dow Chemical), etc.; bixylenol or biphenyl epoxy resins or their mixtures such as YL-6056, YX-4000, YL-6121 (Mitsubishi Chemical), etc.; bisphenol S epoxy resins such as EBPS-200 (Japan Chemical), EPX-30 (ADEKA), EXA-1514 (DIC), etc.; tetraphenol ethane epoxy resins such as jERYL-931 (Mitsubishi Chemical); bisphenol A novolac type epoxy resins such as jER157S (Mitsubishi Chemical); heterocyclic epoxy resins such as TEPIC (Nissan Chemical Industry), etc.; diglycidyl phthalate resins such as BLEMMER DGT (Nippon Oil & Fats), etc.; tetraglycidyl xylenol ethane resins such as ZX-1063 (KUKDO Chemical), etc.; naphthyl-containing epoxy resins such as ESN-190, ESN-360 (Nippon Steel Chemical), HP-4032, EXA-4750, EXA-4700 (DIC), etc.; epoxy resins with a dicyclopentadiene skeleton such as HP-7200, HP-7200H (DIC), etc.; glycidyl methacrylate copolymer-based epoxy resin such as CP-50S, CP-50M (Nippon Oil & Fats), etc.; copolymerized epoxy resin of cyclohexyl maleimide and glycidyl methacrylate; epoxy-modified polybutadiene rubber derivatives such as PB-360 (Daicel); CTBN modified epoxy resins such as YR-102, YR-450 (KUKDO Chemical), etc., but are not limited thereto. Such epoxy resins can be used alone or in combination of two or more, and especially novolac epoxy resins, bixylenol epoxy resins, biphenyl epoxy resins, biphenol novolac epoxy resins, naphthalene epoxy resins or their mixtures are preferred.

The multifunctional oxetane compounds include but are not limited to multifunctional oxetanes, such as bis[(3-methyl-3-oxetanylmethoxy)methyl]ether, bis[(3-ethyl-3-oxetanylmethoxy)methyl]ether, 1,4-bis[(3-ethyl-3-oxetanylmethoxy)methyl]benzene, 1,4-bis[(3-methyl-3-oxetanylmethoxy)methyl]benzene, (3-methyl-3-oxetanyl) methacrylate, (3-ethyl-3-oxetanyl) methacrylate, (3-methyl-3-oxetanyl) methyl methacrylate, (3-ethyl-3-oxetanyl) methyl methacrylate, or oligomers or copolymers of the aforementioned compounds, etc.

The compounds having multiple cyclic thioether groups in the molecules may include: bisphenol A cyclic sulfide resin YL7000 manufactured by Mitsubishi Chemical Corporation. In addition, it is also possible to use a cyclic sulfide resin in which the oxygen atom of the epoxy group of the novolak epoxy resin is substituted with a sulfur atom using the same synthesis method.

When using molecules with cyclic (thio)ether-based thermosetting component, a curing agent can be added to increase the structural strength after thermosetting. The curing agent is, for example, the acid anhydride, phenolic resin or amine compound.

The acid anhydride curing agent is not particularly limited, and examples thereof include, but are not limited to: phthalic anhydride, alkylhexahydrophthalic anhydride (for example, methylhexahydrophthalic anhydride), hexahydrophthalic anhydride, alkyltetrahydrophthalic anhydride (for example, 3-methyltetrahydrophthalic anhydride), tetrahydrophthalic anhydride, trialkyltetrahydrophthalic anhydride, maleic anhydride, butyric anhydride, succinic anhydride, nadic methyl anhydride, trimellitic anhydride, pyromellitic anhydride or methyl norbornene-2,3-dicarboxylic acid. These acid anhydride curing agents can be used alone or in combination of two or more.

The phenolic resin is not particularly limited, but is preferably a novolac resin. The novolac resin is a condensation polymer of phenol, cresol, naphthol, alkylphenol, bisphenol or terpene phenol and formaldehyde. The phenolic resin can be: novolak resin, cresol novolak resin, phenol novolak resin, alkylphenol novolak resin, xylenol novolak resin, butyl phenol novolak resin, biphenol novolak resin, terpene phenol novolak resin, α-naphthol novolak resin, β-naphthol novolak resin, dicyclopentadiene cresol resin, bisphenol A novolak, poly(p-vinylphenol) resin, xylene modified novolak resin, decahydronaphthalene modified novolac resin, poly(di-o-hydroxyphenyl)methane, poly(di-m-hydroxyphenyl)methane, or poly(di-p-hydroxyphenyl) methane.

The above-mentioned amine compound may be: dimethyldiaminotoluene, diaminodibutyltoluene, diaminodipropyltoluene, tetramethyldiaminodiphenylmethane, tetraethyldiaminodiphenylmethane, diethyldimethyldiaminodiphenylmethane, diaminoxylyl sulfone, diaminodiphenyl sulfone, diethyldiaminotoluene, bis(4-amino-3-ethylphenyl)methane or poly tetramethylene-di-p-aminobenzoate. These compounds can be used alone or in combination of two or more.

As to the preferred usage amount of the curing agent, the equivalent number of the functional group of the curing agent is 0.05 to 1.5 equivalents, more preferably 0.1 to 1.2 equivalents, relative to 1 equivalent of cyclic (thio) ether groups.

The (meth)acrylic resin is formed by polymerization of the (meth)acrylate compounds. The (meth)acrylate compound may include, but is not limited to, a difunctional (meth)acrylate compound containing an alkylene chain or an alkoxy chain, a bisphenol epoxy (meth)acrylate compound, or a (meth)acrylate compound having a hydroxyl group. These (meth)acrylic resins can be used alone or in combination of two or more thereof.

The difunctional (meth)acrylate compound containing the alkylene chain includes but is not limited to: the di(meth)acrylates of the diols of ethylene glycol di(meth)acrylate, 3-methyl-1,5 pentanediol bis(meth)acrylate, 1,4-butanediol di(meth)acrylate, 1,3-butanediol di(meth)acrylate, 1,6-hexanediol di(meth)acrylate, 1,10-decanediol di(meth)acrylate, 1,9-nonanediol di(meth)acrylate, neopentyl glycol di(meth)acrylate, glycerol di(meth)acrylate, tricyclodecane dimethanol di(meth)acrylate, polyalkyl glycol(80)di(meth)acrylate, polyalkyl glycol di(meth)acrylate, etc.

The difunctional (meth)acrylate compound containing the alkoxy chain includes but is not limited to: diethylene glycol di(meth)acrylate, triethylene glycol di(meth)acrylate, propoxylated neopentyl glycol di(meth)acrylate (2), polyethylene glycol di(meth)acrylate, polypropylene glycol di(meth)acrylate, polybutylene glycol di(meth)acrylate, polypentylene glycol di(meth)acrylate, ethoxylated bisphenol A di(meth)acrylate (2), ethoxylated bisphenol A di(meth) acrylate (4), ethoxylated bisphenol A di(meth)acrylate (10), ethoxylated bisphenol A di(meth)acrylate (30) and the like. Among them, the number in brackets indicates the number of EO.

Commercial products of the difunctional (meth)acrylate compound containing the alkylene chain or the alkoxy chain include: NK ESTER A-NOD-N (trade name, manufactured by Shin Nakamura Chemical Industry Co., Ltd.), LIGHT ACRYLATE 3EG-A, 4EG-A, 9EG-A, 14EG-A, PTMGA-250, NP-A, MPD-A, 1,6HX-A, 1,9ND-A, BP-4PA (trade name, manufactured by Kyoeisha Chemical Co., Ltd.), HDDA, 1,9-NDA (trade made, manufactured by DAICEL-ALLNEX), EGDMA, DEGDMA, 3EGDMA, NPGDMA, EP80DMA, E2BADMA, E2BADMA (trade name, manufactured by Shirakawa Chemical Co., Ltd.), DM BPA(2EO) DMA, DM BPA(2EO)DMA, DM NPG(2PO)DA, DM PEG (200)DA, DM PEG(200)DMA, DM PEG(400)DA, DM PEG(600)DA (trade name, manufactured by Double Bond Chemical Company), etc.

The bisphenol epoxy (meth)acrylate compound can increase the heat resistance, chemical resistance, hardness, adhesion, toughness, etc. of the adhesive layer, and its examples include but are not limited to: EA-1010N (New Nakamura Chemical) DM127-100, DM127-TP20, DM1283C, DM129, DM1700, DM1701, DM1703, DM1730, DM176-TF, DM186, DM188, DM193A-TF, DM193-TP50 (Double Bond), MIRAMER PE210, PE250, PE110H, PE230, PE310, EA2235, EA2259, EA2280, ME2110 (Miwon), Genomer 2235, 2252, 2253, 2255, 2259, 2263, 2280, 2281, 2312 (RAHN), PHOTOMER 3005, 3016, 3052, 3072, 3316, 3318 and 3319 (IGM). Such bisphenol epoxy (meth)acrylate compound can be used alone or in combination of two or more.

The (meth)acrylate compound having a hydroxyl group includes but is not limited to: 2-hydroxy-3-acryloxypropyl (meth)acrylate, 2-hydroxy-3-phenoxyethyl (meth)acrylate, 1,4-cyclohexanedimethanol mono(meth)acrylate, 2-hydroxyethyl (meth)acrylate, 2-hydroxypropyl (meth)acrylate, 4-hydroxybutyl (meth)acrylate, pentaerythritol tri(meth) acrylate, dipentaerythritol monohydroxy penta(meth)acrylate, 2-hydroxypropyl (meth)acrylate, etc., or hydroxy (meth)acrylate obtained by ring opening of glycidyl ether (meth)acrylate. Specific examples of glycidyl ether (meth) acrylate include, but are not limited to: glycidyl methacrylate, 4-hydroxybutyl acrylate glycidyl ether, and the like.

Commercial products of the (meth)acrylate compound having a hydroxyl group include: MIRAER M100, M1051 (MIWON), ARONIX M-5700 (East Asia Synthesis), 4HBA, 2HEA, CHDMMA (Nippon Chemical Industry), BHEA, HPA, HEMA, HPMA (Japanese Catalyst), Light ester HO, Light ester HOP, Light ester HOA (Kyoeisha Chemical), but are not limited thereto.

The (meth)acrylate compound having a hydroxyl group can be used alone or in combination of two or more. In a preferred embodiment, the (meth)acrylate compound having a hydroxyl group is 2-hydroxy-3-acryloxypropyl acrylate, 2-hydroxy-3-phenoxyethyl acrylate, 2-hydroxyethyl acrylate, 2-hydroxypropyl acrylate, 4-hydroxybutyl acrylate or 1,4-cyclohexanedimethanol monoacrylate. Moreover, in terms of ease of viscosity adjustment, a monofunctional (meth)acrylate compound is preferred.

The urethane resin is not particularly limited, and it can be obtained by polymerizing a polyester polyol and a polyisocyanate.

The modified liquid crystal polymer is not particularly limited. In some embodiments, the modified liquid crystal polymer can be obtained by melt condensation polymerization of one or more of 3,5-dihydroxytoluene, 4,4'-dihydroxybiphenyl, 2,5-dihydroxybiphenyl, 4,4'-dihydroxy diphenylmethane, 3,3',5,5'-tetramethyl-4,4'-dihydroxybiphenyl, 2,2'-dimethyl-4,4'-dihydroxybiphenyl, magnolol, isophthalic acid, terephthalic acid, 3-hydroxybenzoic acid, 4-hydroxybenzoic acid, 4'-hydroxybiphenyl-4-carboxylic acid and 2-hydroxy-6-naphthoic acid.

The polyester resin is not particularly limited, and may be obtained by polycondensation of dicarboxylic acid and polyol.

Commercially available antioxidants can be used, examples of which include, but are not limited to: phenol-based antioxidants, amine-based antioxidants, phosphorus-based antioxidants, sulfur-based antioxidants, or blended antioxidants thereof. These antioxidants can be used alone or in combination of two or more.

Commercial products of the phenol-based antioxidants include, but are not limited to: ADEKASTAB AO-20, ADEKASTAB AO-30, ADEKASTAB AO-40, ADEKASTAB AO-50, ADEKASTAB AO-60, ADEKASTAB AO-80, ADEKASTAB AO-330 (the above are manufactured by Adeka Corp.), IRGANOX1010, IRGANOX1035, IRGANOX1076, IRGANOX1098, IRGANOX1135, IRGANOX1330, IRGANOX1726, IRGANOX1425, IRGANOX1520, IRGANOX245, IRGANOX259, IRGANOX3114, IRGANOX3790, IRGANOX5057, IRGANOX565, IRGAMOD295 (the above are manufactured by BASF Japan) and the like.

Commercial products of the amine-based antioxidants include but are not limited to: ADEKASTAB LA-52, LA-57, LA-63, LA-68, LA-72, LA-77, LA-81, LA-82, LA-87, LA-402, LA-502 (the above are manufactured by Adeka Corp.), CHIMASSORB119, CHIMASSORB2020, CHIMASSORB944, TINUVIN622, TINUVIN123, TINUVIN144, TINUVIN765, TINUVIN770, TINUVIN111, TINUVIN783, TINUVIN791 (the above are manufactured by BASF Japan) and the like.

Commercial products of the phosphorus-based antioxidants include but are not limited to: ADEKASTAB PEP-4C, ADEKASTABPEP-8, ADEKASTAB PEP-36, HP-10, 2112 (the above are manufactured by Adeka Corp.), IRGAFOS168, GSY-P101 (the above are manufactured by Sakai Chemical Industry Corp.), IRGAFOS168, IRGAFOS12, IRGAFOS126, IRGAFOS38, IRGAFOSP-EPQ (the above are manufactured by BASF Japan) and the like.

Commercial products of the sulfur-based antioxidants include but are not limited to: ADEKASTAB AO-412, ADEKASTAB AO-503 (the above are manufactured by Adeka Corp.), IRGANOX PS 800, IRGANOX PS 802 (the above are manufactured by BASF Japan) and the like.

Commercial products of the blended antioxidants include but are not limited to: ADEKASTAB A-611, ADEKASTAB A-612, ADEKASTAB A-613, ADEKASTAB AO-37, ADEKASTAB AO-15, ADEKASTAB AO-18, 328 (the above are manufactured by Adeka Corp.), TINUVIN111, TINUVIN783, TINUVIN791 (the above are manufactured by BASF Japan) and the like.

Among these commercially available products, phenol-based antioxidants and amine-based antioxidants are preferred. The content ratio of the antioxidant is preferably 10 parts by mass or less, more preferably 5 parts by mass or less, and particularly preferably 0.1 to 2 parts by mass, with respect to 100 parts by mass of the adhesive (resin).

In some embodiments, the transparent substrate 110 is polyethylene terephthalate, polyethylene naphthalate, polyimide, polyamide, syndiotactic polystyrene or polyphenylene sulfide. The transparent substrate 110 is preferably a thin film.

From the viewpoint of the transparency of the flexible transparent laminate, the total light transmittance of the transparent substrate 110 is preferably greater than 80%, more preferably greater than 85%. In addition, the Yellow index is less than 5.

From the viewpoint of thinning and miniaturization of the flexible transparent laminate, the thickness of the transparent substrate 110 is preferably 5-25 μm, more preferably 4-15 μm.

In a preferred embodiment, the manufacturing method of the transparent laminate is prepared by the following steps: using an applicator to coat the surface (the first surface) of the transparent substrate with the adhesive composition used to form an adhesive layer and diluted with solvent, thereby forming a coating; drying the coating to form the adhesive layer; depositing a metal on the adhesive layer as a seed layer by sputtering, chemical plating or evaporation, then forming a metal layer by thickening through copper electroplating; and performing annealing at a temperature of 150-200° C. to obtain the transparent laminate.

In order to highlight the efficacy of the present invention, the inventors completed the Examples and Comparative Examples in the manner set out below. The following Examples and Comparative Examples will further illustrate the present invention. However, these Examples and Comparative Examples are not intended to limit the scope of the present invention. Any changes and modifications made by people having ordinary skill in the art of the present invention without departing from the spirit of the present invention will fall within the scope of the present invention.

Preparation Example 1 (AD1)—Thermoplastic Polyimide Resin

In a reaction vessel equipped with the temperature control system, the fractionator and the stirrer, 207.18 g cyclohexanone, 8.32 g toluene, 16.70 g 1,12-dodecamethylene diamine, 43.50 g 2,2-bis[4-(3,4-dicarboxyphenoxy)phenyl] propane dianhydride (BPADA) and 6.5 g triethylamine were added and stirred continuously at 70° C. for 4 hours, and then heated to 160° C. and reacted for 15 hours for dehydration imidization to obtain a thermoplastic polyimide solution. 100 parts by mass of the thermoplastic polyimide (calculated based on the solid content), 8 parts by mass of N,N-diglycidyl-4-glycidyloxyaniline and 0.7 parts by mass of 2-ethyl-4-methylimidazole as the hardening accelerator were mixed to obtain Adhesive 1 (AD1).

Preparation Example 2 (AD2)—Epoxy Resin 100 parts by weight of bisphenol A epoxy resin (EPON™ Resin 1001F manufactured by HEXION), 20 parts by weight of methylhexahydrophthalic anhydride as the acid anhydride hardener, and 0.5 parts by weight of tetrabutylphosphonium O,O-diethyl phosphorodithioate as the catalyst and 80 parts by weight of methyl ethyl ketone (MEK) were mixed to obtain Adhesive 2 (AD2).

Preparation Example 3

(AD3)—(Meth)acrylate Resin 2-ethylhexyl ester (2-EHA), acrylic acid and N,N-dimethylacrylamide (DMAA) were used as monomers, and 1-hydroxycyclohexyl phenyl ketone was added as the photoinitiator to carry out the linear polymerization of monomers and obtain the Poly(2-EHA-co-AA-co-DMAA) oligomers. Next, 80 parts by weight of 2-ethylhexyl ester (2-EHA), 15 parts by weight of Poly(2-EHA-co-AA-co-DMAA) oligomer and 5 parts by weight of 1,4-di-tert-butylperoxyisopropyl benzene were mixed to obtain Adhesive 3 (AD3).

The adhesion promoters used in the Examples and Comparative Examples are as what follows:

Triazole Compound

Compound 1

3-mercapto-1,2,4-triazole

Compound 2

3-amino-5-mercapto-1,2,4-triazole

Thiadiazole Compound

Compound 3

2-amino-5-mercapto-1,3,4-thiadiazole

Compound 4

2,5-dimercapto-1,3,4-thiadiazole

Compound 5

Benzotriazole compound
5-carboxybenzotriazole

The adhesive, adhesion promoter (the triazole compound, thiadiazole compound and benzotriazole compound), antioxidant were taken according to the parts by weight listed in Table 1 and mixed to obtain the adhesive compositions of Example 1 to 7 and Comparative Examples 1 to 6. The adhesive composition was coated on the surface of the transparent polyimide substrate serving as the transparent substrate, and dried at 180° C. for 5 minutes to form the adhesive layer.

Next, the metallization process was performed. In Examples 1 to 7 and Comparative Examples 1 to 3, chemical plating (electroless plating) was used to deposit nickel as a seed layer on the surface of the adhesive layer. The steps of electroless nickel plating include immersing the transparent polyimide substrate containing the adhesive layer in a potassium hydroxide solution with a concentration of 5 M, and performing surface treatment at 50° C. for 1 minute. Next, the steps of electroless nickel plating, including surface charge adjustment, presoak, catalysis, speeding, etc., were performed using the ED process (from JCU). The ED series reagents such as ED500 were purchased from JCU, and the operating conditions were surface treatment at 50° C. for 5 minutes to form a nickel metal layer with a thickness of 0.5 μm on the surface of the adhesive layer.

Before copper electroplating, an acid treatment step must be performed to remove the oxide layer on the nickel surface. The acid treatment solution was 5% sulfuric acid, and the soaking time was 30 seconds. After acid treatment, a copper electroplating step was performed to form a copper layer with a thickness of 12 microns on the nickel metal layer. Finally, annealing at 200° C. was performed for 1 hour to obtain the flexible transparent laminate (FCCL).

In Comparative Example 4-6, the transparent laminate was produced by the rolling method. The copper foil as the metal layer in Comparative Examples 4-6 was attached to the transparent polyimide substrate through the adhesive layer by the rolling process (rolling pressure of 500N/cm$^2$). The surface roughness Rz of the copper foil used in Comparative Examples 4 and 5 was 0.05 μm. The difference between Comparative Examples 4 and 5 was that the antioxidant was added in Comparative Example 5. The surface roughness Rz of the copper foil used in Comparative Example 6 was 0.03 μm.

<Surface Roughness Rz>

The surface of the sample to be measured for surface roughness was cleaned with acetone. After sufficient drying, the surface was measured with a scanning probe microscope (AFM) under the following measurement conditions, and the surface roughness (Rz) was calculated based on the measurement data.

Measurement mode: contact mode
Measurement area: 10 μm×10 μm
Scanning speed: 6.37 μm/s <Total Transmittance (TT) and Haze>

The metal layer on the transparent laminate was etched away with ferric chloride solution. After sufficient water washing and drying at 100° C., the total transmittance and haze of the transparent laminate after removing the metal layer was measured using Nippon Denshoku COH 5500 in accordance with ASTM D1003 specification.

<Yellowness Index YI>

The metal layer on the transparent laminate was etched away with ferric chloride solution. After sufficient water washing and drying at 100° C., the yellowness index YI value of the transparent laminate after removing the metal layer was measured using Nippon Denshoku COH 5500 in accordance with ASTM E313 specification. As to the yellowness index YI, the tristimulus values (x, y, z) were obtained by measuring the transmittance of 400-700 nm light using a spectrophotometer, and the YI value was calculated by the following formula.

$$YI=100\times(1.2769x-1.0592z)/y$$

<Pull-off Strength (Peeling Strength)>

The sample used in the pull-off strength (peel strength) was obtained from cutting the transparent laminated board into a width of 10 mm, and tested with a universal material testing machine. The sample to be tested was stored at room temperature and tested under the conditions described below to obtain the pull-off strength in Table 1. In addition, the sample to be tested was stored at 85° C. and 85 RH % for 240 hours, and tested under the conditions described below to obtain the pull-off strength environmental test in Table 1. The measurement conditions were as what follows:

Pull-off speed: 50 mm/min
Pull-off angle: 180° pull-off (pulling copper foil)
The evaluation of pull-off strength (peeling strength) was based on the following criteria:

◉ Above 7 N/cm
○ Above 5 N/cm and less than 7 N/cm
X Less than 5 N/cm

<Heat Resistance of Solder>

The manufacturing method of the sample to be tested was the same as the method set forth in the above pull-off strength test, and according to the method of IPC-TM650-2.4.13, after soaking in a solder tank at 288° C. for 10 seconds for 3 times, the transparent laminate was visually observed to check whether there was bulging or copper peeling.

Evaluation Criteria
  ○: Without peeling or bulging of laminate material
  ×: With peeling or bulging of laminate pounds can enhance the bonding between the metal layer and the adhesive layer, so that the laminate of the present invention will not be affected by the temperature and humidity of the environment and can maintain excellent properties.

However, the above are only preferred embodiments of the present invention, and should not be used to limit the scope of implementation of the present invention. Therefore, all the simple and equivalent changes and modifications made according to the claims and the specification of the present application are still within the scope of the present invention.

What is claimed is:
1. A laminate, comprising:
   a transparent substrate having a total light transmittance of greater than 80%;

TABLE 1

|  |  | Ex. 1 | Ex. 2 | Ex. 3 | Ex. 4 | Ex. 5 | Ex. 6 | Ex. 7 | Comp. Ex. 1 | Comp. Ex. 2 | Comp. Ex. 3 | Comp. Ex. 4 | Comp. Ex. 5 | Comp. Ex. 6 |
|---|---|---|---|---|---|---|---|---|---|---|---|---|---|---|
| Adhesive | AD1 | 100 | 100 | 100 | 100 | 100 |  |  | 100 |  |  | 100 | 100 | 100 |
|  | AD2 |  |  |  |  |  | 100 |  |  | 100 |  |  |  |  |
|  | AD3 |  |  |  |  |  |  | 100 |  |  | 100 |  |  |  |
| Adhesion promoter | Compound 1 | 0.1 |  |  |  |  | 0.1 | 0.1 |  |  |  | 0.1 | 0.1 | 0.1 |
|  | Compound 2 |  | 0.1 |  |  |  |  |  |  |  |  |  |  |  |
|  | Compound 3 |  |  | 0.1 |  |  |  |  |  |  |  |  |  |  |
|  | Compound 4 |  |  |  | 0.1 |  |  |  |  |  |  |  |  |  |
|  | Compound 5 |  |  |  |  | 0.1 |  |  |  |  |  |  |  |  |
| Antioxidant |  | 1 | 1 | 1 | 1 | 1 | 1 | 1 | 0 | 0 | 0 | 0 | 1 | 1 |
| Thickness of adhesive layer |  | 5 | 4.5 | 5 | 4 | 5 | 4 | 4 | 5 | 4 | 5 | 5 | 5 | 5 |
| Rz | μm | 0.03 | 0.04 | 0.03 | 0.02 | 0.03 | 0.03 | 0.02 | 0.03 | 0.08 | 0.12 | 0.05 | 0.05 | 0.03 |
| TT | % | 89.4 | 88.8 | 89.2 | 89.1 | 88.7 | 88.7 | 90.1 | 87.1 | 86.7 | 85.2 | 86.4 | 86.5 | 87.1 |
| Haze | % | 0.65 | 0.8 | 1.1 | 1.3 | 0.97 | 0.76 | 0.56 | 5.2 | 10.3 | 9 | 20 | 18 | 12 |
| YI | — | 3.1 | 2.9 | 3.3 | 2.7 | 3.1 | 2.6 | 2.5 | 3 | 2.5 | 3.2 | 3.1 | 3.1 | 3 |
| Pull-off strength | — | ◉ | ◉ | ◉ | ◉ | ◉ | ◉ | ○ | ○ | ◉ | ○ | ◉ | ◉ | ○ |
| Pull-off strength environmental test | — | ◉ | ◉ | ○ | ○ | ◉ | ◉ | ○ | X | ○ | X | ○ | ○ | X |
| Heat resistance of solder | — | ○ | ○ | ○ | ○ | ○ | ○ | ○ | ○ | ○ | X | ○ | ○ | X |
| YI after heat resistance of solder test |  | 4.1 | 3.8 | 4.2 | 3.8 | 4.3 | 3.6 | 3.9 | 8.7 | 10.6 | 9.4 | 8.5 | 4.3 | 4.1 |
| ΔYI |  | 1 | 0.9 | 1.1 | 1.1 | 1.2 | 1 | 1.4 | 5.7 | 8.1 | 6.2 | 5.4 | 1.2 | 1.1 |

The results from Examples 1-7 and Comparison 1-3 show that adding different triazole compounds, thiadiazole compounds or benzotriazole compounds to the same adhesive can improve the adhesion between the adhesive layer and the metal layer, and haze after etching can also be effectively reduced to within 5%. Adhesives without the addition of triazole compound, thiadiazole compound or benzotriazole compound have unsatisfactory haze performance, which is greater than 5%, and poor peeling strength performance. In addition, from the results of Example 1 and Comparative Examples 4-6, it is known that in the adhesive layers added with triazole compounds, the transparent laminate produced by the rolling method will greatly increase the haze of the adhesive layer due to the high pressure bonding through rolling.

It can be seen from the above that the addition of triazole compounds, thiadiazole compounds or benzotriazole coman adhesive layer formed by an adhesive composition and located on and in contact with the transparent substrate; and
a metal layer located on and in contact with the adhesive layer, and a surface roughness (Rz) of a contact side of the metal layer with the adhesive layer is less than 0.05 μm,
wherein the transparent substrate is selected from polyimide, polyamide, syndiotactic polystyrene or polyphenylene sulfide, a haze of the laminate after removing the metal layer is less than or equal to 5%, the metal layer is formed by forming a seed layer and then electroplating, the adhesive composition comprises a resin, an adhesion promoter and an antioxidant, and the adhesion promoter comprises a triazole compound represented by formula (1), a thiadiazole compound represented by formula (2), a benzotriazole compound represented by formula (3), a phosphate oligomer or a combination thereof:

(1)

(2)

(3)

wherein
$R^1$, $R^2$, $R^3$ and $R^4$ each independently represent H, $NH_2$, SH, OH, COOH, Ph, a hydrocarbon group having 1 to 8 carbon atoms, or a hydrocarbon group having 1 to 8 carbon atoms with an end functional group, which is selected from $NH_2$, SH, OH, COOH or Ph; and
$R^5$ represents H, $NH_2$, SH, OH, COOH, $CH_3$ or $C_2H_5$.

2. The laminate of claim 1, wherein the seed layer is formed by sputtering, chemical plating or deposition.

3. The laminate of claim 1, wherein the resin comprises a thermoplastic resin, a thermosetting resin, a (meth)acrylic resin, an urethane resin, a modified liquid crystal polymer, a polyester resin or a combination thereof.

4. The laminate of claim 1, wherein the triazole compound represented by formula (1) comprises or a combination thereof.

5. The laminate of claim 1, wherein the thiadiazole compound represented by formula (2) comprises -continued or a combination thereof.

6. The laminate of claim 1, wherein the benzotriazole compound represented by formula (3) comprises or a combination thereof.

7. The laminate of claim 1, wherein the phosphate oligomer comprises acrylic phosphate, alcohol phosphate, alcohol and alkyl ether phosphate, alcohol and alkyl polyethylene glycol ether phosphate or a combination thereof.

8. A method for preparing a laminate, comprising:
providing a transparent substrate having a total light transmittance of greater than 80%;
forming an adhesive layer on and in contact with the transparent substrate, in which the adhesive layer is formed by an adhesive composition; and
forming a metal layer on and in contact with the adhesive layer to obtain a laminate,
wherein
the transparent substrate is selected from polyimide, polyamide, syndiotactic polystyrene or polyphenylene sulfide;
a haze of the laminate after removing the metal layer is less than or equal to 5%;
a surface roughness (Rz) of a contact side of the metal layer with the adhesive layer is less than 0.05 µm;
the metal layer is formed by forming a seed layer and then electroplating; and
the adhesive composition comprises a resin, an adhesion promoter and an antioxidant, and the adhesion promoter comprises a triazole compound represented by formula (1), a thiadiazole compound represented by formula (2), a benzotriazole compound represented by formula (3), a phosphate oligomer or a combination thereof:

(1)

(2)

(3)

wherein $R^1$, $R^2$, $R^3$ and $R^4$ each independently represent H, $NH_2$, SH, OH, COOH, Ph, a hydrocarbon group having 1 to 8 carbon atoms, or a hydrocarbon group having 1 to 8 carbon atoms with an end functional group, which is selected from $NH_2$, SH, OH, COOH or Ph; and $R^5$ represents H, $NH_2$, SH, OH, COOH, $CH_3$ or $C_2H_5$.

9. The method of claim 8, wherein the seed layer is formed by sputtering, chemical plating or deposition.

10. The method of claim 8, wherein the triazole compound represented by formula (1) comprises or a combination thereof.

11. The method of claim 8, wherein the thiadiazole compound represented by formula (2) comprises or a combination thereof.

12. The method of claim 8, wherein the benzotriazole compound represented by formula (3) comprises or a combination thereof.

13. The method of claim 8, wherein the phosphate oligomer comprises acrylic phosphate, alcohol phosphate, alcohol and alkyl ether phosphate, alcohol and alkyl polyethylene glycol ether phosphate or a combination thereof.

* * * * *